United States Patent
Si

(10) Patent No.: US 11,128,743 B2
(45) Date of Patent: Sep. 21, 2021

(54) SLIDE STRUCTURE OF ELECTRONIC DEVICE

(71) Applicant: BEIJING XIAOMI MOBILE SOFTWARE CO., LTD., Beijing (CN)

(72) Inventor: Xinwei Si, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/660,723

(22) Filed: Oct. 22, 2019

(65) Prior Publication Data

US 2020/0137208 A1 Apr. 30, 2020

(30) Foreign Application Priority Data

Oct. 25, 2018 (CN) .......................... 201811272936.4

(51) Int. Cl.
*H04M 1/02* (2006.01)
*G06F 1/16* (2006.01)
(Continued)

(52) U.S. Cl.
CPC ........ *H04M 1/0237* (2013.01); *G06F 1/1624* (2013.01); *H05K 5/0086* (2013.01); *H05K 5/03* (2013.01); *H04M 1/0264* (2013.01)

(58) Field of Classification Search
CPC combination set(s) only.
See application file for complete search history.

(56) References Cited

U.S. PATENT DOCUMENTS

2006/0231620 A1* 10/2006 Kim ................... H04M 1/0237
235/441
2008/0062656 A1* 3/2008 Kim ..................... H01Q 1/243
361/747

(Continued)

FOREIGN PATENT DOCUMENTS

CN 202026351 U 11/2011
CN 202282795 U 6/2012

(Continued)

OTHER PUBLICATIONS

European Patent Office, Extended European Search Report mailed in Application No. 19205399.9, dated Mar. 16, 2020, Germany, 10 pages.

(Continued)

*Primary Examiner* — Junpeng Chen
(74) *Attorney, Agent, or Firm* — Syncoda LLC; Feng Ma

(57) ABSTRACT

A slide structure and an electronic device can affect a relative sliding movement between a first structure and a second structure of the electronic device. The slide structure includes a first cover and a second cover; a fixed member fixed to the second cover on a surface facing the first cover, where first receiving spaces are formed between the fixed member and the surface of the second cover and extend along a relative sliding direction of the electronic device; a fitting member including cover portions extending along the relative sliding direction, one part of the cover portions extending into the first receiving spaces and the other part fixed to the first cover on a surface facing the second cover, so that the fixed member is slidable along the second receiving spaces formed between the cover portions and the surface of the first cover.

13 Claims, 6 Drawing Sheets

(51) Int. Cl.
*H05K 5/00* (2006.01)
*H05K 5/03* (2006.01)

(56) References Cited

U.S. PATENT DOCUMENTS

| | | | |
|---|---|---|---|
| 2008/0139261 A1 | 6/2008 | Cho et al. | |
| 2009/0262486 A1* | 10/2009 | Shi | H04M 1/0237 361/679.01 |
| 2010/0085721 A1* | 4/2010 | Dong | H04M 1/0237 361/807 |
| 2010/0091437 A1* | 4/2010 | Dong | H04M 1/0237 361/679.01 |
| 2010/0246110 A1* | 9/2010 | Kubo | H04M 1/0237 361/679.01 |
| 2010/0323772 A1* | 12/2010 | Kiryu | H04M 1/0237 455/575.4 |
| 2011/0130178 A1* | 6/2011 | Shin | H04M 1/0237 455/575.4 |
| 2012/0200998 A1* | 8/2012 | Giustina | G06F 1/1624 361/679.55 |
| 2013/0108196 A1* | 5/2013 | Mitsui | E05F 11/44 384/40 |

FOREIGN PATENT DOCUMENTS

| | | |
|---|---|---|
| EP | 1422911 A2 | 5/2004 |
| EP | 2151975 A1 | 2/2010 |
| KR | 100697622 B1 | 3/2007 |
| KR | 100741014 B1 | 7/2007 |

OTHER PUBLICATIONS

State Intellectual Property Office of the People's Republic of China, Office Action and Search Report Issued in Application No. 2018112729364, dated Sep. 2, 2020, 18 pages, (Submitted with Machine Translation).

State Intellectual Property Office of the People's Republic of China, Office Action and Search Report Issued in Application No. 201811272936.4, dated May 6, 2021, 9 pages.

* cited by examiner

SLIDE STRUCTURE OF ELECTRONIC DEVICE

CROSS-REFERENCE TO RELATED APPLICATIONS

The present application claims priority of Chinese Patent Application No. 201811272936.4 filed on Oct. 25, 2018, the disclosure of which is hereby incorporated by reference in its entirety.

BACKGROUND

Users nowadays have a need for lightweight electronic devices, while appreciating the superior experience of large screens. Therefore, it is desired to increase the screen size as much as possible within the limited dimensions of electronic devices.

SUMMARY

The present disclosure relates generally to the field of terminal technologies, and more specifically to a slide structure and an electronic device.

Various embodiments of the present disclosure provide a slide structure, and an electronic device.

According to a first aspect of the examples of the present disclosure, a slide structure is provided. The slide structure serves to affect a relative sliding movement between a first structure and a second structure of an electronic device and includes:

a first cover and a second cover, disposed between the first structure and the second structure, where the first cover is fitted together with the first structure, and the second cover is fitted together with the second structure;

a fixed member fixed to the second cover on a surface facing the first cover; where the fixed member forms first receiving spaces with the surface of the second cover, with the first receiving spaces extending in a relative sliding direction of the electronic device; and a fitting member including a cover portion that extend along the relative sliding direction, with one part of the cover portions extending into the first receiving spaces and the other part fixed to the first cover on a surface facing the second cover, so that the fixed member is slidable in a second receiving space formed between the cover portion and the surface of the first cover.

In some embodiments, the fixed member includes two side edges parallel to the sliding direction, and the first receiving space is formed between each of the side edges of the fixed member and the surface of the second cover, respectively.

In some embodiments, the fixed member is in a sheet shape; the fixed member is smooth on a surface away from the second cover; and the fixed member is thinner at the two side edges than at other parts so that the first receiving spaces are formed.

In some embodiments, the fitting member includes two cover portions mating with the two side edges; and the fitting member further includes a connection portion, and two ends of the connection portion are respectively connected with the two cover portions to form a U-shaped or H-shaped structure.

In some embodiments, the connection portion is engaged with the fixed member to stop the sliding movement when the first structure and the second structure slide from a closed state to an open state.

In some embodiments, the cover portions are fixed to an edge of a preset recess in the first cover; where the cover portions partially overlap the preset recess so that the second receiving spaces are formed between the cover portions and the preset recess.

According to a second aspect of the examples of the present disclosure, an electronic device is provided, including:

a first structure and a second structure;

a first slide structure disposed between the first structure and the second structure, where a distance between the first slide structure and a first end of the electronic device in a preset direction is no greater than a preset length, and a distance between the first slide structure and a second end of the electronic device in the preset direction is greater than the preset length;

a second slide structure, being any of the slide structures of the first aspect, and disposed between the first structure and the second structure, where the second slide structure is between the first slide structure and the second end of the electronic device, and a distance between the second slide structure and the second end of the electronic device in the preset direction is no greater than the preset length.

In some embodiments, gaps between the first structure and the second structure at the first slide structure and the second slide structure in the thickness direction synergize with the preset length so that gaps in a thickness direction between the first structure and the second structure at two ends in a preset direction is no greater than a preset value.

In some embodiments, the electronic device includes a mainboard area, a battery area, and an antenna area disposed sequentially in the preset direction, the first slide structure being disposed at the battery area and the second slide structure being disposed at the mainboard area.

In some embodiments, a first gap between the first structure and the second structure in a thickness direction at the mainboard area is smaller than a second gap between the first structure and the second structure in the thickness direction at the battery area, a thickness of the first slide structure is no greater than the second gap, and a thickness of the second slide structure is no greater than the first gap.

The above general description and the following detailed description are intended to be illustrative and not limiting the present disclosure.

BRIEF DESCRIPTION OF DRAWINGS

The accompanying drawings, which are incorporated in and forms part of the disclosure, illustrates the examples of the present disclosure and serve to explain the principles of some embodiments of the present disclosure.

DETAILED DESCRIPTION

Examples will be described in detail herein, with illustrations of which expressed in the accompanying drawings. When drawings are involved in the description below, like numerals represent like or similar elements in the different drawings unless otherwise indicated. The embodiments described in the following examples do not represent all embodiments consistent with the present disclosure. Instead, they are merely examples of devices and methods consistent with some aspects of the present disclosure as detailed in the appended claims.

The terminology used herein is for the purpose of describing particular embodiments, and is not intended to be limiting of the present disclosure. Singular terms determined by "a," "the" and "said" are intended to also include plurality, unless clearly indicated otherwise in the context. It should also be understood that the term "and/or" as used herein refers to and encompasses any and all possible combinations of one or more of the associated listed items.

It should be understood that although the terms "first," "second," "third," etc. may be used to describe various information in this application, such information should not be limited to these terms. These terms are only used to distinguish the same type of information from each other. For example, the first information may also be referred to as the second information without departing from the scope of the present application. Similarly, the second information may also be referred to as the first information. Depending on the context, the word "if" as used herein may be interpreted as "when" or "as" or "in response to a determination."

Layered structures for electronic devices have been proposed, in which components such as a camera module are displaced to a lower layer, so that areas in an upper layer where the components such as the camera module and the like are originally disposed may be cover with a screen to increase a screen size; and at the same time, by pushing and pulling different layers via built-in slide structures, the components such as the camera module and the like may still function properly.

The various device components, units, blocks, or portions may have modular configurations, or are composed of discrete components, but nonetheless can be referred to as "modules" in general. In other words, the "components," "modules," "blocks," "portions," or "units" referred to herein may or may not be in modular forms.

Figure 1:
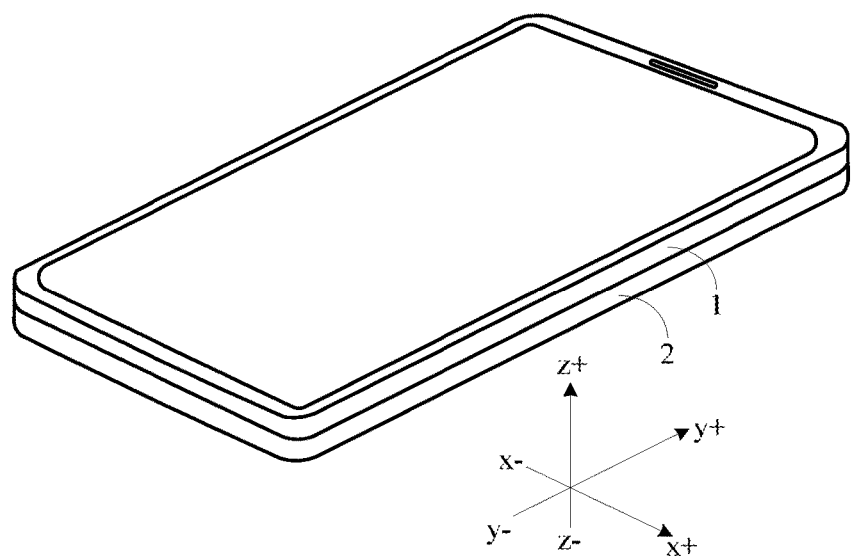
FIG. 1 is a schematic diagram of a perspective structure of an electronic device according to an example.

FIG. 1 is a schematic diagram of a perspective structure of an electronic device according to an example. As shown in FIG. 1, the electronic device includes a first structure 1 and a second structure 2. For example, the first structure 1 may be a screen module, and the second structure 2 may be a middle frame component which contains built-in parts such as a mainboard, a battery, an antenna and the like. The electronic device can be divided into two parts in other ways, which is not limited herein. The first structure 1 and the second structure 2 are stacked along the thickness direction of the electronic device.

As shown in FIG. 1, the width direction of the electronic device (hereinafter also referred to as the sinistro-dextral direction) is the x-axis direction (specifically, it may be divided into a x+ direction towards the right side of the electronic device and a x− direction towards the left side of the electronic device), the length direction (hereinafter also referred to as the supero-inferior direction) is the y-axis direction (specifically, it may be divided into a y+direction towards the top of the electronic device and a y− direction towards the bottom of the electronic device), and the thickness direction (hereinafter also referred to as the antero-superior direction) is the z-axis direction (specifically, it may be divided into a z+direction towards the front of the electronic device and a z−direction towards the back of the electronic device).

In an example, the first structure 1 and the second structure 2 may be substantially the same in size in the x and the y directions, so that the electronic device has a better feel of integrity. In other examples, there may be a certain difference in size between the first structure 1 and the second structure 2 due to requirements in appearance or structural design, which is not limited herein.

In a case that the second structure 2 comprises a relatively large number of functional components, especially components like batteries that occupy a relatively large space, the second structure 2 may have a larger size in the z direction than the first structure 1. In another example, the first structure 1 and the second structure 2 may be substantially the same in size in the z direction, in other words, the electronic device is equally divided into the first structure 1 and the second structure 2 in the z direction, giving itself a better visual aspect. In other examples, size specifications of the first structure 1 and the second structure 2 in the z direction may be determined according to actual needs, which is not limited herein.

In some embodiments, the electronic device can be a mobile phone, a tablet computer, a personal digital assistant, etc., and can further include components such a microphone, a speaker, etc., to realize communication and multimedia functions.

Figure 2:
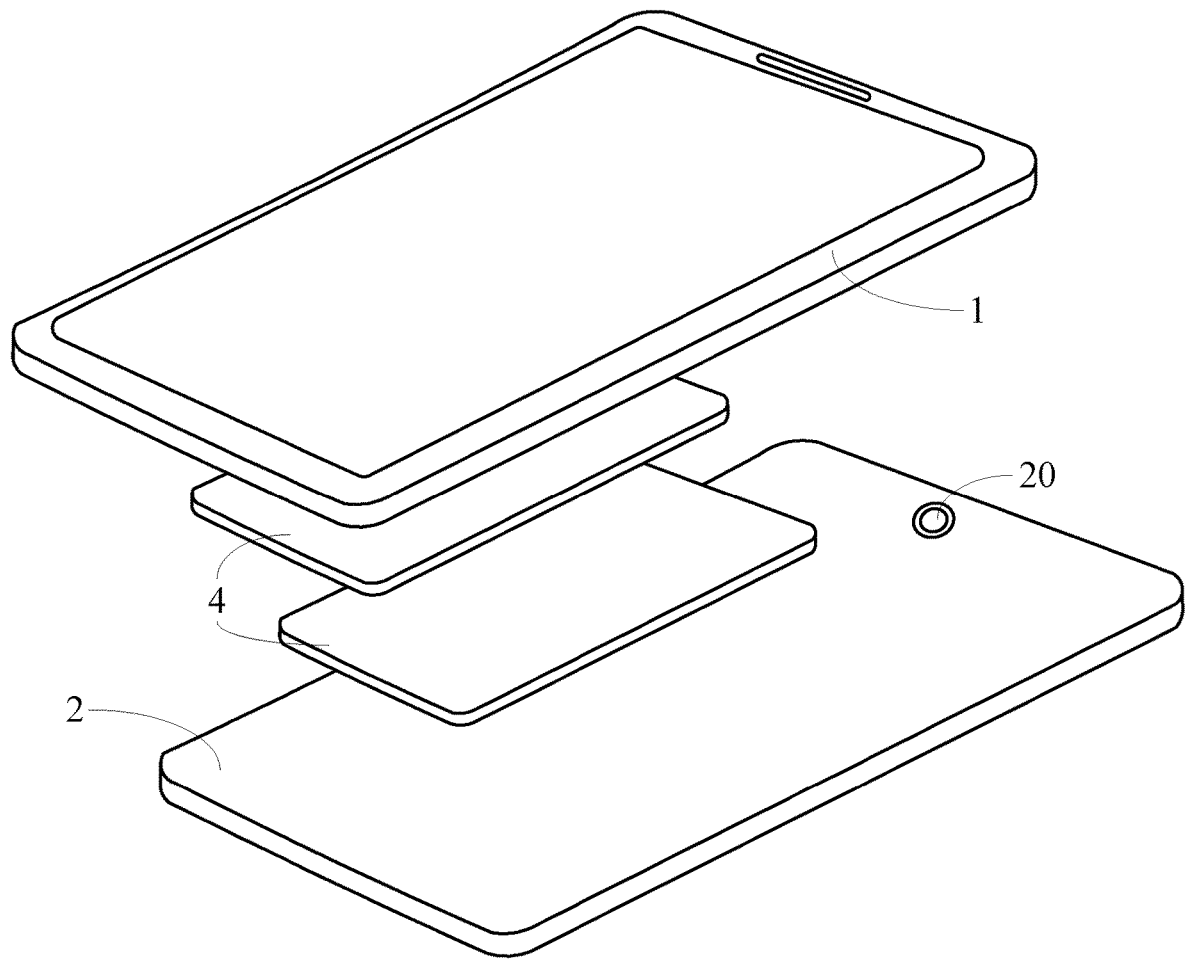
FIG. 2 is a schematic diagram of an exploded structure of the electronic device shown in FIG. 1.
Figure 3:
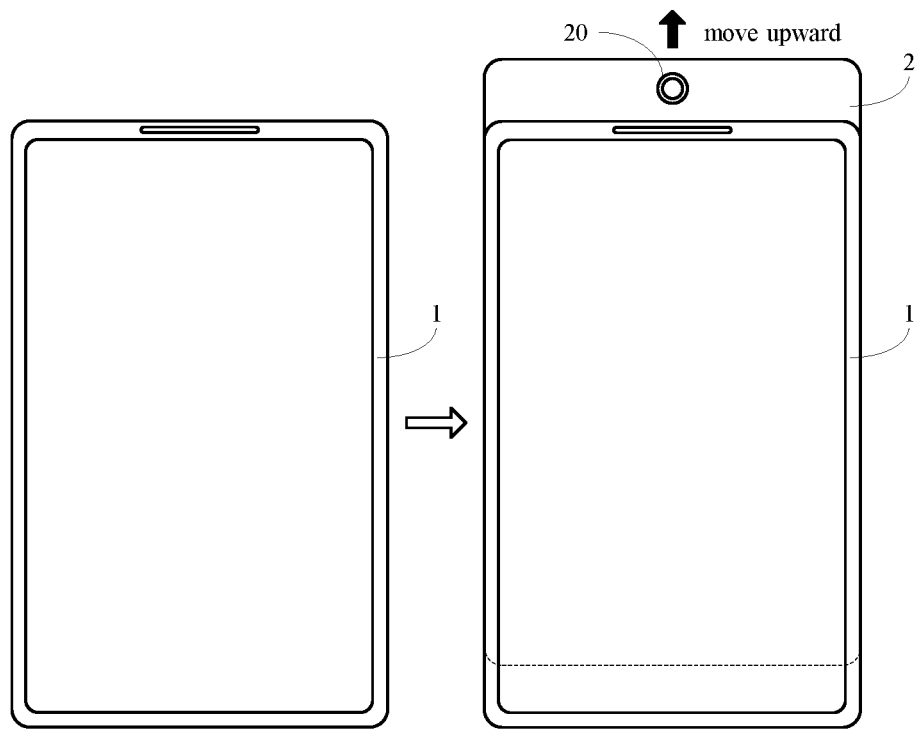
FIG. 3 is a schematic diagram showing a relative sliding movement between a first structure and a second structure in the electronic device shown in FIG. 1.

FIG. 2 is a schematic diagram of an exploded structure of the electronic device shown in FIG. 1. As shown in FIG. 2, a slide structure 4 is disposed between the first structure 1 and the second structure 2, and a relative sliding movement between the first structure 1 and the second structure 2 may be achieved based on the slide structure 4. FIG. 3 is a schematic diagram showing a relative sliding movement between a first structure and a second structure in the electronic device shown in FIG. 1. As shown in FIG. 3, the second structure 2 moves upward relative to the first structure 1, so that at least a portion of the surface of the second structure 2 at its upper end is exposed, where components such as a camera 20 or the like are provided. For example, when the first structure 1 includes a screen module, with the disposition of the camera 20 on the second structure 2, a relevant area on the first structure 1 can be spared to increase the screen-to-body ratio. In other examples, the first structure 1 may also move downward relative to the second structure 2 to expose a corresponding part of the surface of the second structure 2, which is not limited herein.

Figure 4:
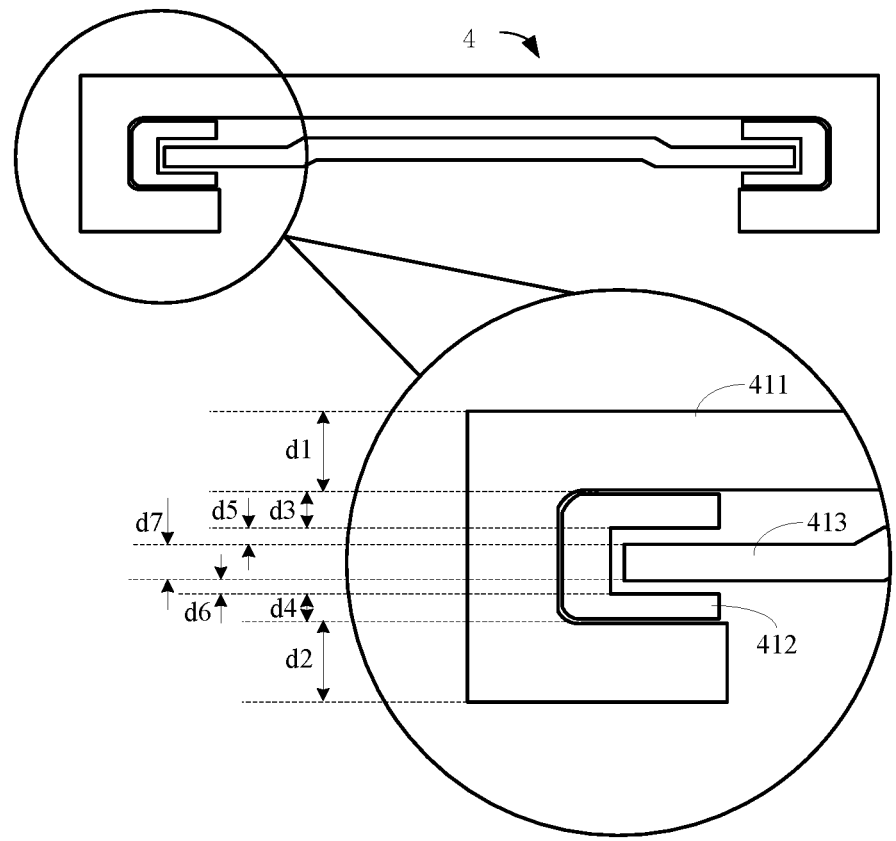
FIG. 4 is a schematic diagram of a slide structure in a y-axis direction.

FIG. 4 is a schematic diagram of a slide structure in a y-axis direction. As shown in FIG. 4, the slide structure includes a fixed portion 411, slide rails 412, and a slider 413. The top of the fixed portion 411 is fixed to the bottom surface of the first structure 1 and the bottom of the slider 413 is fixed to the top surface of the second structure 2. The fixed portion 411 is in a plate shape as a whole and formed with bends at both sides, and one slide rail 412 is secured to the inner sides of each bend. In this way, the slider 413 engages with the slide rails 412 on both sides to effect a sliding movement, and causes the first structure 1 and the second structure 2 to slide relative to each other.

For the slide structure shown in FIG. 4, a thickness D along the z-axis consists of: d1 and d2, thicknesses of upper and lower portions of the fixed portion 411; d3 and d4, thicknesses of upper and lower portions of the slide rail 412; d5, a gap between the slider 413 and the upper portion of the slide rail 412; d6, a gap between the slider 413 and the lower portion of the slide rail 412; and d7, a thickness of the slider 413. So, the total thickness D of the slide structure=d1+d2+d3+d4+d5+d6+d7. Considering the processing technology, the above values of d1 to d7 are generally: d1=0.8 mm, d2=0.7 mm, d3=0.325 mm, d4=0.325 mm, d5=0.075 mm, d6=0.075 mm, d7=0.4 mm. Thus, the total thickness D=2.7 mm.

Figure 10:
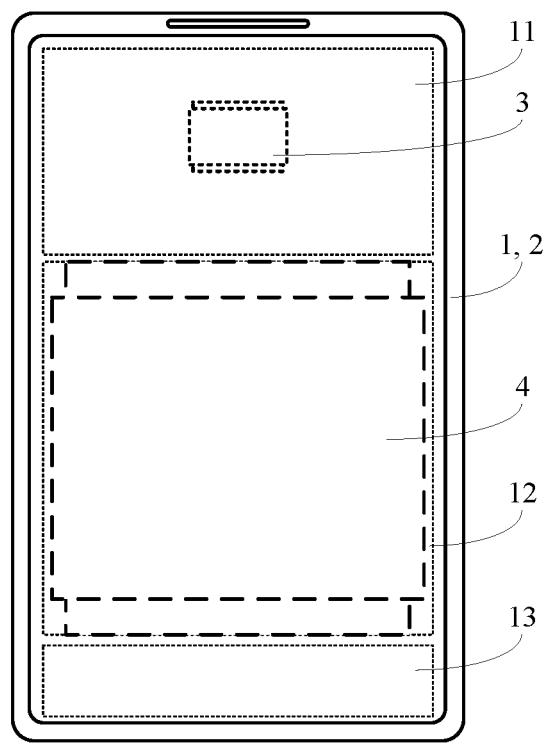
FIG. 10 is a schematic diagram showing a location of slide structures in an electronic device according to an example.

However, the first structure 1 and the second structure 2 in the mainboard area (as shown in FIG. 10) are relatively close, with a gap of, for example, only 1.92 mm, which is much smaller than the above-mentioned D (2.7 mm). On account of this, the slide structure shown in FIG. 4 is not applicable to the mainboard area of an electronic device, and if applied forcedly, it will result in an increased thickness of the electronic device, which is against the lightweight design principle.

In order to meet the thickness requirements of the electronic devices, the present disclosure provides a new slide structure 3 that can work in concert with the first structure 1 and the second structure 2 to effect a relative sliding movement without causing an increased thickness of the electronic device. Correspondingly, FIG. 5 is a schematic diagram of an exploded structure of a slide structure according to an example.

Figure 5:
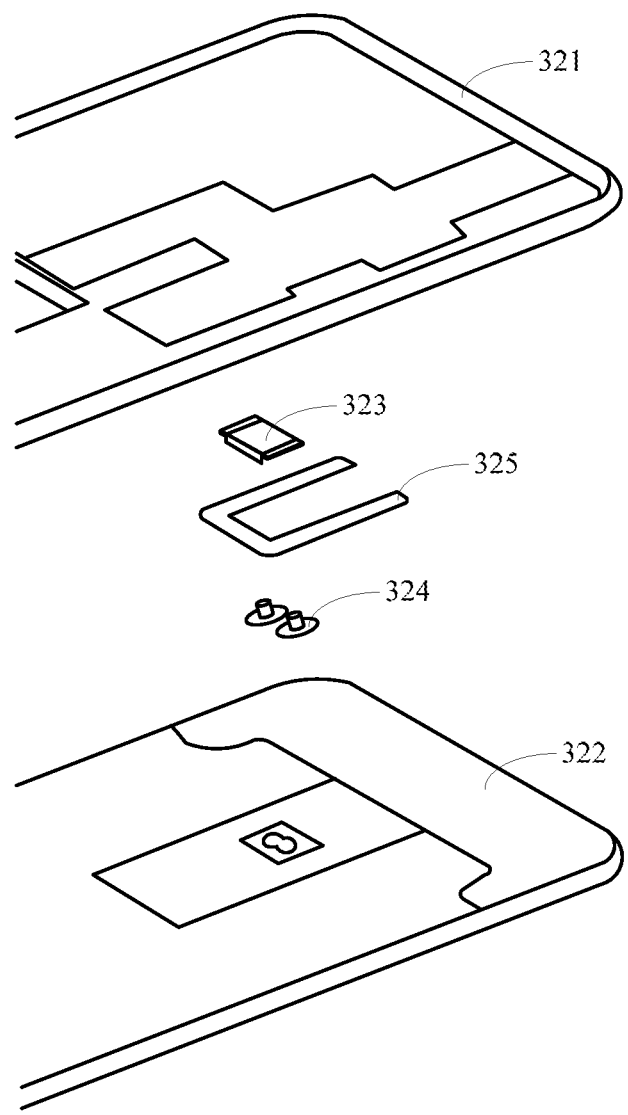
FIG. 5 is a schematic diagram of an exploded view of a slide structure according to an example.

As shown in FIG. 5, the slide structure 3 includes a first cover 321 and a second cover 322, both of which are disposed between the first structure 1 and the second structure 2. Moreover, the first cover 321 can be fitted together with the first structure 1, and the second cover 322 can be fitted together with the second structure 2.

The slide structure 3 may further include a fixed member 323, fixed to the second cover 322 on a surface facing the first cover 321 (that is the upper surface of the second cover 322 shown in FIG. 5). For example, the fixed member 323 may be fixed to the second cover 322 by lock screws 324. Other fixing methods such as bonding and welding may also be used, which is not limited herein;

The slide structure 3 may further include a fitting member 325, fixed to the first cover 321 on a surface facing the second cover (that is the lower surface of the first cover 321 shown in FIG. 5). For example, the fitting member 321 may be fixed to the first cover 321 by screw locking, bonding, welding, etc., which is not limited herein. The fitting member 325 may cooperate with the fixed member 323 to effect a relative sliding movement between the two members, and further between the first structure 1 and the second structure 2.

Figure 6:
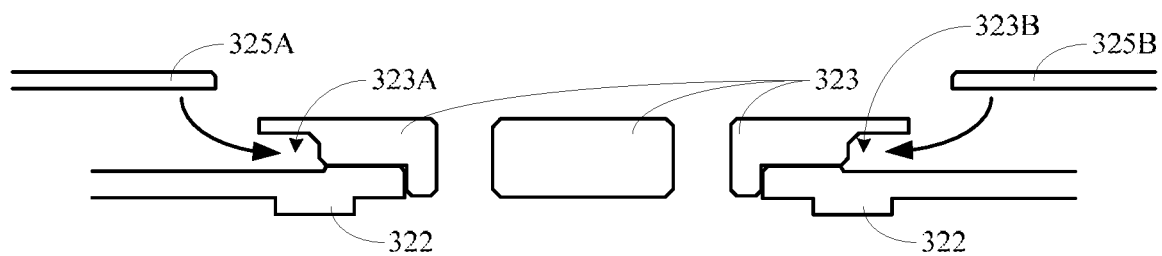
FIG. 6 is a schematic diagram of a fixed member of a slide structure and related structures thereof in a y-axis direction according to an example.

FIG. 6 is a schematic diagram of a fixed member of a slide structure and related structures thereof in a y-axis direction according to an example. As shown in FIG. 6, first receiving spaces 323A and 323B are formed between the fixed member 323 and the surface of the second cover 322, with the first receiving spaces 323A and 323B extending along the relative sliding direction of the electronic device (i.e. the y-axis direction), and thus only a cross section of the first receiving spaces 323A and 323B is shown in FIG. 6.

For example, the fixed member 323 may include two side edges parallel to the y-axis direction, and the fixed member 323 forms two first receiving spaces, each between one of the two side edges and the surface of the second cover 322 and represented in FIG. 6 as the first receiving space 323A on the left and the first receiving space 323B on the right, respectively. The first receiving spaces 323A and 323B may take various forms. For example, the fixed member 323 may be in a sheet shape. The fixed member 323 is smooth on a surface away from the second cover 322 (i.e. the upper surface), and the fixed member 323 is thinner at the two side edges (i.e. the left and right side edges shown in FIG. 6) than at other parts, so that the first receiving spaces 323A and 323B as shown in FIG. 6 are formed.

When the fixed member 323 forms the first receiving spaces 323A and 323B as shown in FIG. 6, the fitting member 325 may include two corresponding cover portions 325A and 325B that extend along the above-mentioned relative sliding direction (i.e. the y-axis direction), with a right part of the cover portion 325A extending into the first receiving space 323A and a left part of the cover portion 325B extending into the first receiving space 323B, so that the cover portions 325A and 325B may engage with the first receiving spaces 323A and 323B to effect a relative sliding movement along the y-axis direction.

Figure 7:
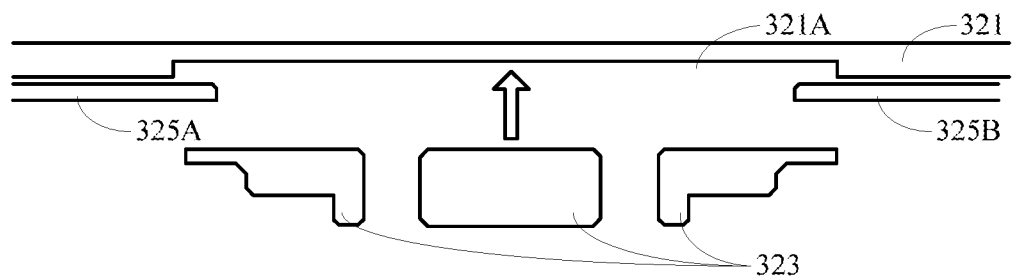
FIG. 7 is a schematic diagram of a fitting member of a slide structure and related structures thereof in a y-axis direction according to an example.

FIG. 7 is a schematic diagram of a fitting member of a slide structure and related structures thereof in a y-axis direction according to an example. As shown in FIG. 7, when the fitting member 325 includes the above-mentioned cover portions 325A and 325B, parts of the cover portions 325A and 325B may be fixed to the first cover 321 on a surface facing the second cover 322 (i.e. the lower surface in FIG. 7), for example, a left part of the cover portion 325A and a right part of the cover portion 325B are both fixed to the lower surface of the first cover 321, and second receiving spaces may be formed by other parts of the cover portions 325A and 325B and the lower surface of the first cover 321; while the cover portions 325A and 325B engage with the first receiving spaces 323A and 323B, the above-mentioned fixed member 323 may be received in the second receiving spaces and work in concert with the second receiving spaces, so that the fixed member 323 and the fitting member 325 may slide along the y-axis direction relative to each other.

In an example, the first cover 321 includes a preset recess 321A, and the cover portions 325A and 325B may be fixed to an edge of the preset recess 321A. For example, in FIG. 7, a left part of the cover portion 325A is fixed to a left edge of the preset recess 321A and a right part of the cover portion 325B is fixed to a right edge of the preset recess 321A. The cover portions 325A and 325B partially overlap the preset recess, and more specifically, a right part of the cover portion 325A and a left part of the cover portion 325B partially overlap the preset recess, so that the second receiving spaces are formed therefrom. In other examples, the second receiving spaces may be formed in other ways, for example, instead of the preset recess 321A, Z-shaped cover portions 325A and 325B are provided to form the second receiving spaces. Such detail is not limited herein.

Figure 8:
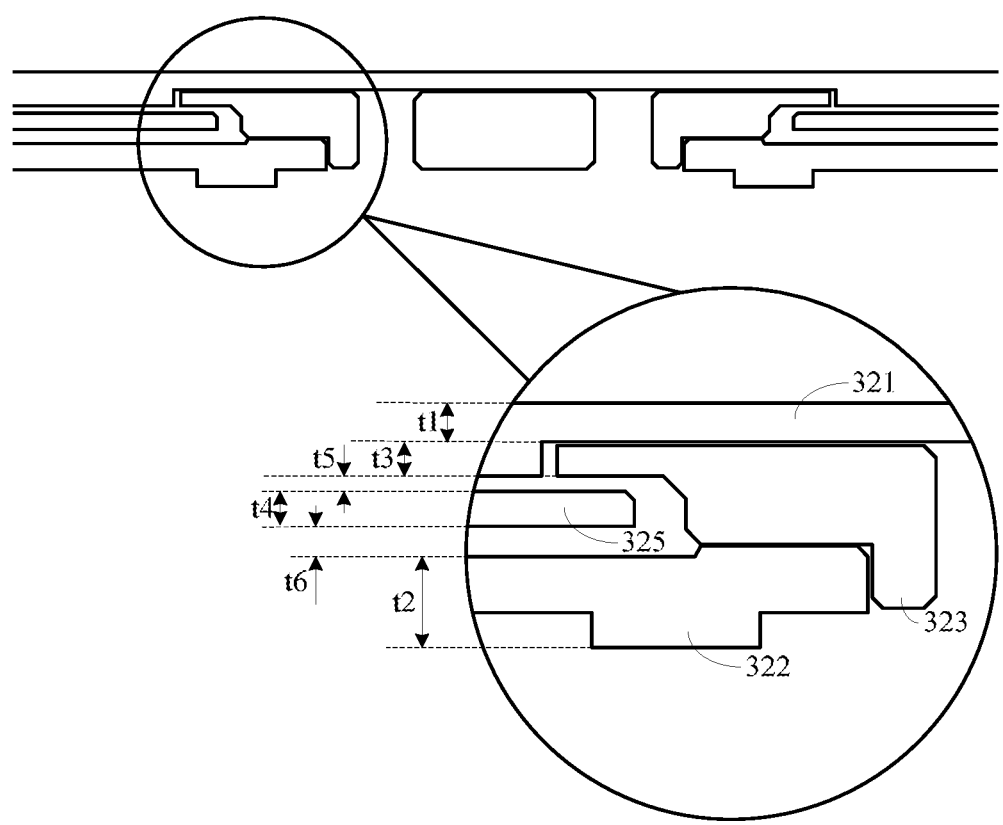
FIG. 8 is a schematic diagram of a slide structure in a y-axis direction according to an example.

FIG. 8 is a schematic diagram of a slide structure in a y-axis direction according to an example. As shown in FIG. 8, for the slide structure 3 shown in FIGS. 5-7, a thickness T along the z-axis direction consists of: t1, a thickness of the first cover 321 at the preset recess 321A; t2, a thickness of the second cover 322; t3, a thickness of the fixed member 323 at its side edges; t4, a thickness of the fitting member 325; t5, a gap between the fitting member 325 and the side edge of the fixed member 323; and t6, a gap between the fitting member 325 and the second cover 322. So, the total thickness T of the slide structure 3=t1+t2+t3+t4+t5+t6. Considering the processing technology, values of the above-mentioned t1 to t6 are generally: t1=0.3 mm, t2=0.72 mm, t3=0.3 mm, t4=0.25 mm, t5=0.1 mm, t6=0.25 mm. Thus, the total thickness T=1.92 mm. The sliding part of the slide structure has a thickness of only 0.95 mm (sum of t1+t3+t4+t5), which satisfies the requirement of 1.92 mm of a gap between the first structure 1 and the second structure 2. Using such a slide structure avoids an increased thickness of the electronic device and conforms to the lightweight design principle.

Figure 9:
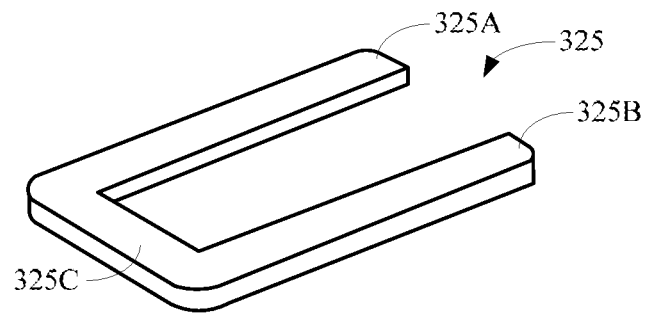
FIG. 9 is a schematic diagram of a perspective structure of a fitting member of a slide structure according to an example.

FIG. 9 is a schematic diagram of a perspective view of a fitting member of a slide structure according to an example. As shown in FIG. 9, when the fitting member 325 includes the cover portions 325A and 325B, the fitting member 325 may further include a connection portion 325C, and the connection portion 325C may be connected at its two ends with the two cover portions 325A and 325B to form a U-shaped structure as shown in FIG. 9. Surely, an H-shaped structure or the like may be formed in other examples, which is not limited herein.

Take the U-shaped structure shown in FIG. 9 as an example. The connection portion 325C joins the cover portions 325A and 325B and makes the fitting member 325 into an integrated whole. Compared to separately disposed cover portions 325A and 325B, such structure has better structural strength and is more stable in sliding. In addition, an assembly efficiency in production process is improved, with only one assembly operation for the whole structure rather than for each of the cover portions, so that a high assembly precision is maintained.

Furthermore, the inclusion of the connection portion 325C in the fitting member 325 makes it possible for the connection portion 325C to cooperate with the fixed member 323 or assist other structure to stop the sliding movement when the first structure and the second structure slide from a closed state to an open state.

FIG. 10 is a schematic diagram showing where slide structures are disposed in an electronic device according to an example. As shown in FIG. 10, the electronic device is divided into a mainboard area 11, a battery area 12, an antenna area 13, and the like in the y-axis direction; where in order to meet a clearance requirement of antenna structures, the slide structure should be avoided from being disposed in the antenna area 13. A gap between the first structure 1 and the second structure 2 in the thickness direction is relatively small at the mainboard area 11 and relatively large at the battery area 12, so in order to eliminate or minimize an increase of thickness in the z-axis direction of the electronic device, the slide structure 3 (as shown in FIGS. 5 to 9) may be disposed at the mainboard area 11 and the slide structure 4 (as shown in FIG. 4) at the battery area 12. The slide structure 4, having relatively larger dimensions (one or more of length, width, thickness, etc.) and capable of bearing greater loads, may be used as a primary slide structure and the slide structure 3, having relatively smaller dimensions and capable of bearing less loads, may be used as a secondary slide structure. In this way, a relative sliding movement between the first structure and the second structure is jointly realized by the slide structure 3 and the slide structure 4 and thus becomes more stable and reliable.

Figure 11:
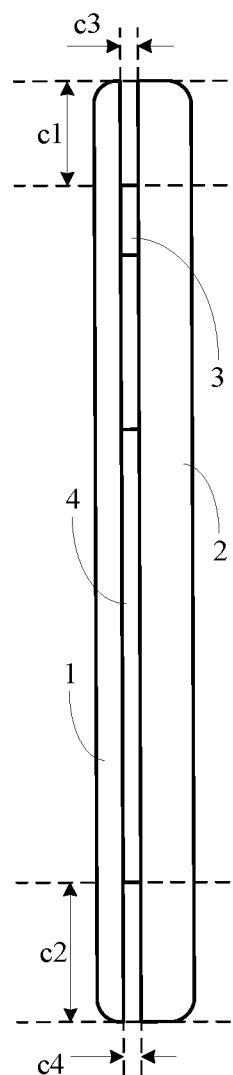
FIG. 11 is a schematic diagram of the electronic device in FIG. 10 viewed in an x-axis direction.

FIG. 11 is a schematic diagram of the electronic device in FIG. 10 viewed in an x-axis direction. As shown in FIG. 11, the first structure 1 and the second structure 2 are joined at the slide structure 3 and the slide structure 4. It is assumed that a distance between the slide structure 3 and a top surface of the electronic device is $c_1$, a distance between the slide structure 4 and a bottom surface of the electronic device is $c_2$, and a gap between the first structure and the second structure at the top surface in the thickness direction is $c_3$ and a gap at the bottom surface is $c_4$.

When a gap between the first structure 1 and the second structure 2 at the slide structure 3 in the thickness direction is $T_1$, under the influence of component processing precision, assembly precision, structural stress, etc., $c_3$ may be greater than $T_1$, and an increase in the gap $c_3$ is positively related to the distance $c_1$ between the slide structure 3 and the top surface of the electronic device. Similarly, when a gap between the first structure 1 and the second structure 2 at the slide structure 4 in the thickness direction is $T_2$, under the influence of component processing precision, assembly precision, structural stress, etc., $c_4$ may be greater than $T_2$, and an increase in the gap $c_4$ is positively related to the distance $c_2$ between the slide structure 4 and the bottom surface of the electronic device.

By disposing both the slide structure 3 and the slide structure 4, the two slide structures 3 and 4 as a whole affects the gaps of the electronic device at both the top and bottom ends. When disposing the slide structure 3 near the top surface and the slide structure 4 near the bottom surface, it is only desired to separately consider $c_1$ (the distance between the slide structure 3 and the top surface of the electronic device) and $c_2$ (the distance between the slide structure 4 and the bottom surface of the electronic device), without having to consider the distance between the slide structure 3 and the bottom surface of the electronic device or the distance between the slide structure 4 and the top surface of the electronic device.

Therefore, corresponding to the gaps $T_1$ and $T_2$, by making the distance $c_1$ no greater than a predefined distance threshold $D_1$ and the distance $c_2$ no greater than a predefined distance threshold $D_2$, it is ensured that the gaps of the electronic device at both the top and bottom ends do not increase excessively, for example $c_3$ and $c_4$ are both no greater than a predefined gap threshold $d_0$. In this way, quality control requirements are satisfied.

Viewed differently other than from the x-axis direction, the slide structures 3 and 4 may be no greater than a preset length away from edges on both sides in the width direction of the electronic device (i.e., viewed in the y-axis direction). Therefore, it is ensured that the gaps of the electronic device at the left and right surfaces also meet predefined quality control requirements. This is consistent with the example in the length direction described above and will not be described herein again.

As such, quality control requirements in both the left-right and top-bottom directions can be satisfied.

It should be understood that "a plurality" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

In the description of the present disclosure, the terms "some embodiments," "example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombinations.

Moreover, although features can be described above as acting in certain combinations and even initially claimed as such, one or more features from a claimed combination can in some cases be excised from the combination, and the claimed combination can be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A slide structure, configured to effect a relative sliding movement between a first structure and a second structure of an electronic device, comprising:
 a first cover disposed between the first structure and the second structure and fitted together with the first structure;
 a second cover disposed between the first structure and the second structure and fitted together with the second structure;
 a fixed member fixed to the second cover on a surface thereof facing the first cover and forming a first receiving space with the surface of the second cover, the first receiving space extending in a sliding direction in which the first structure and the second structure slide relative to each other; and
 a fitting member comprising a cover portion that extends in the sliding direction, with one part of the cover portion extending into the first receiving space and the other part of the cover portion fixed to the first cover on a surface thereof facing the second cover, so that the fixed member is slidable in a second receiving space formed between the cover portion and the surface of the first cover;
 wherein the fixed member comprises two side edges parallel to the sliding direction; and the first receiving space is formed between each of the two side edges of the fixed member and the surface of the second cover, respectively;
 wherein the fitting member comprises two cover portions mating with the two side edges;
 wherein the fitting member further comprises a connection portion, and two ends of the connection portion are respectively connected with the two cover portions to form a U-shaped or H-shaped structure;
 wherein
 the cover portion is fixed to an edge of a preset recess in the first cover; and
 the cover portion is partially overlapped with the preset recess so that the second receiving space is formed between the cover portion and the preset recess.

2. The slide structure according to claim 1, wherein
the fixed member is in a sheet shape;
a surface of the fixed member away from the second cover is smooth; and
the fixed member is thinner at the two side edges than at other parts to form the first receiving space respectively.

3. The slide structure according to claim 1, wherein the connection portion is engaged with the fixed member to stop the sliding movement when the first structure and the second structure slide from a closed state into an open state.

4. An electronic device, comprising:
a first structure;
a second structure;
a first slide structure disposed between the first structure and the second structure, where a distance between the first slide structure and a first end of the electronic device in a preset direction is no greater than a preset length, and a distance between the first slide structure and a second end of the electronic device in the preset direction is greater than the preset length
a second slide structure disposed between the first structure and the second structure, where the second slide structure is between the first slide structure and the second end, and a distance between the second slide structure and the second end of the electronic device in the preset direction is no greater than the preset length;
wherein the second slide structure comprises:
a first cover fitted together with the first structure;
a second cover fitted together with the second structure;
a fixed member fixed to the second cover on a surface thereof facing the first cover and forming a first receiving space with the surface of the second cover, the first receiving space extending in a sliding direction in which the first structure and the second structure slide relative to each other;
a fitting member comprising a cover portion that extends in the sliding direction, with one part of the cover portion extending into the first receiving space and the other part of the cover portion fixed to the first cover on a surface thereof facing the second cover, so that the fixed member is slidable in a second receiving space formed between the cover portion and the surface of the first cover;
wherein the fixed member comprises two side edges parallel to the sliding direction, and the first receiving space is formed between each of the two side edges of the fixed member and the surface of the second cover, respectively;
wherein the fitting member comprises two cover portions mating with the two side edges;
wherein the fitting member further comprises a connection portion, with two ends of the connection portion being respectively connected to the two cover portions to form a U-shaped or H-shaped structure;
wherein the electronic device comprises a mainboard area, a battery area, and an antenna area disposed sequentially in the preset direction, the first slide structure being disposed at the battery area and the second slide structure being disposed at the mainboard area;
wherein a first gap between the first structure and the second structure in a thickness direction at the mainboard area is smaller than a second gap between the first structure and the second structure in the thickness direction at the battery area, a thickness of the first slide structure is no greater than the second gap, and a thickness of the second slide structure is no greater than the first gap.

5. The electronic device according to claim 4, wherein gaps in the thickness direction between the first structure and the second structure at the first slide structure and the second slide structure respectively synergize with the preset length, so that gaps in the thickness direction between the first structure and the second structure at two end portions respectively in the preset direction is no greater than a preset value.

6. The electronic device according to claim 4, wherein the first slide structure comprises:
a fixed portion, fixed at its top to a bottom surface of the first structure, having a plate shape as a whole and formed with bends at both sides;
a slider, fixed at its bottom to a top surface of the second structure; and
slide rails, fixed to the bends on the inner sides thereof, so that the slider engages with the slide rails at both sides to effect a sliding movement.

7. The electronic device according to claim 4, wherein the fixed member is in a sheet shape, is smooth on a surface away from the second cover, and is thinner at the two side edges than at other parts to form the first receiving space.

8. The electronic device according to claim 4, wherein the connection portion is engaged with the fixed member to stop the sliding movement when the first structure and the second structure slide from a closed state into an open state.

9. An electronic device, comprising:
a first structure;
a second structure;
a first slide structure disposed between the first structure and the second structure, where a distance between the first slide structure and a first end of the electronic device in a preset direction is no greater than a preset length, and a distance between the first slide structure and a second end of the electronic device in the preset direction is greater than the preset length
a second slide structure disposed between the first structure and the second structure, where the second slide structure is between the first slide structure and the second end, and a distance between the second slide structure and the second end of the electronic device in the preset direction is no greater than the preset length;
wherein the second slide structure comprises:
a first cover fitted together with the first structure;
a second cover fitted together with the second structure;
a fixed member fixed to the second cover on a surface thereof facing the first cover and forming a first receiving space with the surface of the second cover, the first receiving space extending in a sliding direction in which the first structure and the second structure slide relative to each other;
a fitting member comprising a cover portion that extends in the sliding direction, with one part of the cover portion extending into the first receiving space and the other part of the cover portion fixed to the first cover on a surface thereof facing the second cover, so that the fixed member is slidable in a second receiving space formed between the cover portion and the surface of the first cover;
wherein the fixed member comprises two side edges parallel to the sliding direction, and the first receiving space is formed between each of the two side edges of the fixed member and the surface of the second cover, respectively;

wherein the fitting member comprises two cover portions mating with the two side edges;

wherein the fitting member further comprises a connection portion, with two ends of the connection portion being respectively connected to the two cover portions to form a U-shaped or H-shaped structure;

wherein the cover portion is fixed to an edge of a preset recess in the first cover; and the cover portion is partially overlapped with the preset recess so that the second receiving space is formed between the cover portion and the preset recess.

10. The electronic device according to claim 9, wherein the connection portion is engaged with the fixed member to stop the sliding movement when the first structure and the second structure slide from a closed state into an open state.

11. The electronic device according to claim 9, wherein the fixed member is in a sheet shape;

a surface of the fixed member away from the second cover is smooth; and the fixed member is thinner at the two side edges than at other parts to form the first receiving space respectively.

12. A mobile phone comprising the slide structure according to claim 1, wherein the mobile phone is the electronic device and further comprises:

the first structure and the second structure joined at the slide structure;

wherein the slide structure comprises a first slide structure and a second slide structure;

a distance between the second slide structure and a top surface of the mobile phone is $c1$;

a distance between the first slide structure and a bottom surface of the electronic device is $c2$;

a gap between the first structure and the second structure at the top surface in a thickness direction of the mobile phone is $c3$;

a gap between the first structure and the second structure at the bottom surface is $c4$;

a gap between the first structure and the second structure at the first slide structure in the thickness direction is $T1$;

an increase in $c3$ is positively related to the distance $c1$;

a gap between the first structure and the second structure at the second slide structure in the thickness direction is $T2$; and an increase in $c4$ is positively related to $c2$.

13. The mobile phone according to claim 12, wherein the first slide structure and the second slide structure collectively affect gaps of the mobile phone at both the top and bottom surfaces;

$c1$ is no greater than a predefined distance threshold $D1$;

$c2$ is no greater than a predefined distance threshold $D2$;

such that the gaps of the mobile phone at both the top and bottom ends do not increase excessively, and $c3$ and $c4$ are both no greater than a predefined gap threshold $d0$;

the first slide structure and the second slide structure are no greater than a preset length away from edges on both left and right sides of the mobile phone, such that gaps of the mobile phone at the edges on both the left and right sides also meet predefined quality control requirements.

* * * * *